United States Patent [19]
Caklovic

[11] Patent Number: 5,974,179
[45] Date of Patent: Oct. 26, 1999

[54] BINARY IMAGE DATA COMPRESSION AND DECOMPRESSION

[75] Inventor: Nenad Caklovic, Palo Alto, Calif.

[73] Assignee: Integrated Device Technology, Inc., Santa Clara, Calif.

[21] Appl. No.: 08/387,528

[22] Filed: Feb. 13, 1995

[51] Int. Cl.[6] ................................ G06K 9/36; G06K 9/46
[52] U.S. Cl. .................... 382/232; 382/244; 382/246; 348/420; 348/422; 358/433
[58] Field of Search ..................................... 348/420, 422, 348/413; 382/232, 246, 244; 358/433, 261.3; 341/50

[56] References Cited

U.S. PATENT DOCUMENTS

| | | | |
|---|---|---|---|
| 4,697,233 | 9/1987 | Scheuneman et al. | 395/496 |
| 4,706,264 | 11/1987 | Cung | 382/244 |
| 5,046,122 | 9/1991 | Nakaya et al. | 358/261.3 |
| 5,109,437 | 4/1992 | Honda | 382/244 |
| 5,231,679 | 7/1993 | Matsuura et al. | 382/232 |
| 5,455,576 | 10/1995 | Clark, II et al. | 341/50 |
| 5,506,621 | 4/1996 | Ogasawara et al. | 348/420 |

*Primary Examiner*—Leo H. Boudreau
*Assistant Examiner*—Daniel G. Mariam
*Attorney, Agent, or Firm*—Skjerven,Morrill, MacPherson,Franklin & Friel

[57] ABSTRACT

A method for preprocessing a binary file for data compression under a dictionary-based data compression algorithm takes advantage of redundancy in a two-dimensional binary image. The method rearranges a linear representation of a binary image, i.e. a representation based on pixels of horizontal lines, to a two-dimensional representation, i.e. a representation based on a sequence of adjoining picture areas, to achieve an improvement of compression ratio. The present invention is applicable to dictionary-based data compression methods, such as LZW, LZ77 and LZ78.

4 Claims, 10 Drawing Sheets

```
/* mix several lines together, output bytes will have pixels from several lines */ mixbytes ( inbuf, outbuf, bufsize, nl )
char *inbuf, *outbuf;
unsigned bufsize, nl;
{
        int line;
        unsigned lsize;
        char inmask, omask;
        unsigned inbyte, obyte;

lsize = bufsize/nl;            /* size of one line */ inmask = 0x80;
        line = 0;
        inbyte = 0;
        for( obyte=0; obyte<bufsize; obyte++ )
        {
                for( omask=0x80; omask>0; omask>>=1 )
                {
                        if( inbuf[inbyte + line * lsize] & inmask )
                                outbuf[obyte] |= omask;
                        line++;
                        if( line >= nl )
                        {
                                line = 0;
                                inmask >>= 1;
                                if( inmask == 0 )
                                {
                                        inmask = 0x80;
                                        inbyte++;
                                }
                        }
                }
        }
}
```

*FIG. 3*

| file | size regular | size new method | compression regular | compression new method |
|---|---|---|---|---|
| scoop.600 | 433395 | 235103 | 9.71585 | 17.9104 |
| busplan1.600 | 376320 | 191717 | 11.1894 | 21.9636 |
| golfer.600 | 143986 | 82791 | 29.2445 | 50.8606 |
| hat.600 | 613345 | 596067 | 6.8653 | 7.06431 |
| ledger.600 | 560873 | 250723 | 7.50758 | 16.7946 |
| math.600 | 278481 | 165424 | 15.1206 | 25.4546 |
| schem.600 | 148697 | 70963 | 28.318 | 59.338 |
| sstest2.600 | 230787 | 226597 | 18.2454 | 18.5828 |
| textpage.600 | 1577267 | 1000173 | 2.66968 | 4.21007 |
| topograf.600 | 1254955 | 710089 | 3.35534 | 5.92996 |
| zabriski.600 | 1241255 | 1207603 | 3.39237 | 3.48691 |
| bignet.600 | 1601365 | 856325 | 2.62951 | 4.91729 |
| flyhead2.600 | 978233 | 825805 | 4.3045 | 5.09902 |
| fractals.600 | 1210803 | 799413 | 3.47769 | 5.26736 |

```
/* low level unmix routine to restore original forma of data */ unmixbytes ( inbuf, outbuf, bufsize, nl )
char *inbuf, *outbuf;
unsigned bufsize, nl;
{
        int line;
        unsigned lsize;
        char inmask, outmask;
        unsigned inbyte, outbyte;

lsize = bufsize/nl;          /* size of one line */ outmask = 0x80;
        line = 0;
        outbyte = 0;
        for( inbyte=0; inbyte<bufsize; inbyte++ )
        {
                for( inmask=0x80; inmask>0; inmask>>=1 )
                {
                        if( inbuf[inbyte] & inmask )
                                outbuf[outbyte + line * lsize] |= outmask;
                        line++;
                        if( line >= nl )
                        {
                                line = 0;
                                outmask >>= 1;
                                if( outmask == 0 )
                                {
                                        outmask = 0x80;
                                        outbyte++;
                                }
                        }
                }
        }
}
```

BINARY IMAGE DATA COMPRESSION AND DECOMPRESSION

BACKGROUND OF THE INVENTION

1. Field of the Invention

The present invention relates to image processing. In particular, the present invention relates to data compression technology used in a binary representation of an image.

2. Discussion of the Related Art

A binary image is a representation of an image using a two-dimensional array of picture elements ("pixels"), where each pixel is represented by a single bit. Typically, the binary image is seen as constituted by a number of vertically arranged horizontal lines of pixels. Corresponding to this view, the binary image is stored line-by-line, i.e. the pixels in the top-most horizontal line is stored first, followed by the remaining lines in the order of their vertical positions. Such a binary image is typically used in a facsimile transmission or in a laser printer. Because of redundancy in an image, a binary image is often compressed to a more compact format to allow the binary image to occupy less storage space or a shorter transmission time. The original one-bit-per-pixel binary image is recovered by a corresponding decompression when required to be rendered for display or print.

One class of methods for compressing binary images in the prior art is the class of dictionary-based compression methods or algorithms. Dictionary-based compression methods include such methods as LZW, LZ77 and LZ78, which are well-known methods in the prior art. In a dictionary-based method, the binary image is read as a bit stream. As the bit stream is read, a "dictionary"—i.e. a collection of bit patterns encountered in the bit stream—is compiled. When a previously encountered bit pattern is seen, a dictionary code identifying an entry in the dictionary corresponding to the bit pattern, rather than the bit pattern itself, is substituted. The dictionary code is almost always represented by a number of bits which is less than the number of bits in the bit pattern the dictionary code identifies. Thus, significant saving in storage space or transmission time is realized, especially in a binary image where repetition of bit patterns occur frequently. Programs implementing dictionary-based compressions are readily available. For example, a utility program, called "compress", for performing a dictionary-based compression on a UNIX data file is released with many implementations of the UNIX operating system.

In the dictionary-based compression method described above, because the image is read as bit patterns in a sequence of horizontal lines, only redundancy in the bit patterns along the horizontal direction is exploited. Most binary images, however, possess redundancy in the vertical direction as well. Hence, the present invention described below exploits redundancy in both the vertical and horizontal directions effectively to accomplish a statistically higher level of compression not achieved in the prior art.

SUMMARY OF THE INVENTION

In accordance with the present invention, a method and a system for improving compression of a binary image are provided. The method of the present invention is applicable to a representation of a binary image in which the binary image is provided as pixels of a plurality of horizontal lines arranged vertically. The method of the resent invention involves the steps of: a) providing, in a storage medium, a first representation of the binary image, such that sequential accesses to the representation in the storage medium yields data representing adjoining pixels of each of the horizontal lines; b) preprocessing the binary image by rearranging the first representation of the binary image into a second representation of the binary image, the second representation organized in the storage medium such that sequential accesses to the storage medium obtain pixels of adjoining two-dimensional picture areas of the binary image; and c) compressing the second representation of the binary image using a dictionary-based compression algorithm.

The method of the present invention, when implemented in a byte-oriented computer system, has best result with each of the two-dimensional picture areas representing a number of pixels equalling a multiple of eight. The same advantage can be obtained in such a computer system if the output data of the sequential accesses to the storage medium are packed in a memory word. The present method can be used to preprocess a binary image stored in a data file, or performed "on-the-fly" for a binary image stored in a portion of a memory in a computer system.

In accordance with one aspect of the present invention, an apparatus for compressing a binary image is provided, which includes a preprocessor for preprocessing the binary image by incorporating vertical redundancy in each group of output image data. The groups of output image data are then compressed according to a dictionary compression algorithm. The present invention provides also a decompressor and a postprocessor for reversing the data processing in the compressor and the preprocessor respectively.

The preprocessor of the present invention performs the tasks of: (i) segmenting each scan line of the binary image into segments of equal number of pixels, (ii) grouping the binary image into data groups, each data group including a segment of pixels from each of a number of adjacent scan lines, where the segments of pixels in each data group represents pixels at corresponding locations of the adjacent scan lines, and (iii) dividing each data group into a number of data units, each data unit including pixels selected from each of the adjacent scan lines within the data group.

In one embodiment, the preprocessor includes: (i) a plurality of registers for receiving a data group defined above, where each register receives one of the segments of pixels in the data group; (ii) a first control circuit, receiving a data group of the binary image at a time, which loads the segments of pixels of the received data group into the registers; and (iii) a second control circuit, which output from the plurality of registers the data units. A postprocessor corresponding to the preprocessor of this embodiment can be provided also using the same number of registers, a first control circuit for reading into the registers decompressed data units of a data group, and reading out of the registers the segments of pixels of the data group.

The present invention is better understood upon consideration of the detailed description below and the accompanying drawings.

BRIEF DESCRIPTIONS OF THE DRAWINGS AND THE APPENDIX

Appendix A is an implementation of preprocessor 601 in a utility program for providing, in an output file, a rearranged binary image of a binary image provided in an input file, using the routine "mixbytes" of FIG. 3.

Appendix B is an implementation of postprocessor 604 in a utility program for restoring from a rearranged decompressed binary image, provided in an input file, a binary image to be placed in an output file, using the routine "unmixbytes" of FIG. 6.

DETAILED DESCRIPTION OF THE PREFERRED EMBODIMENTS

Figure 1:
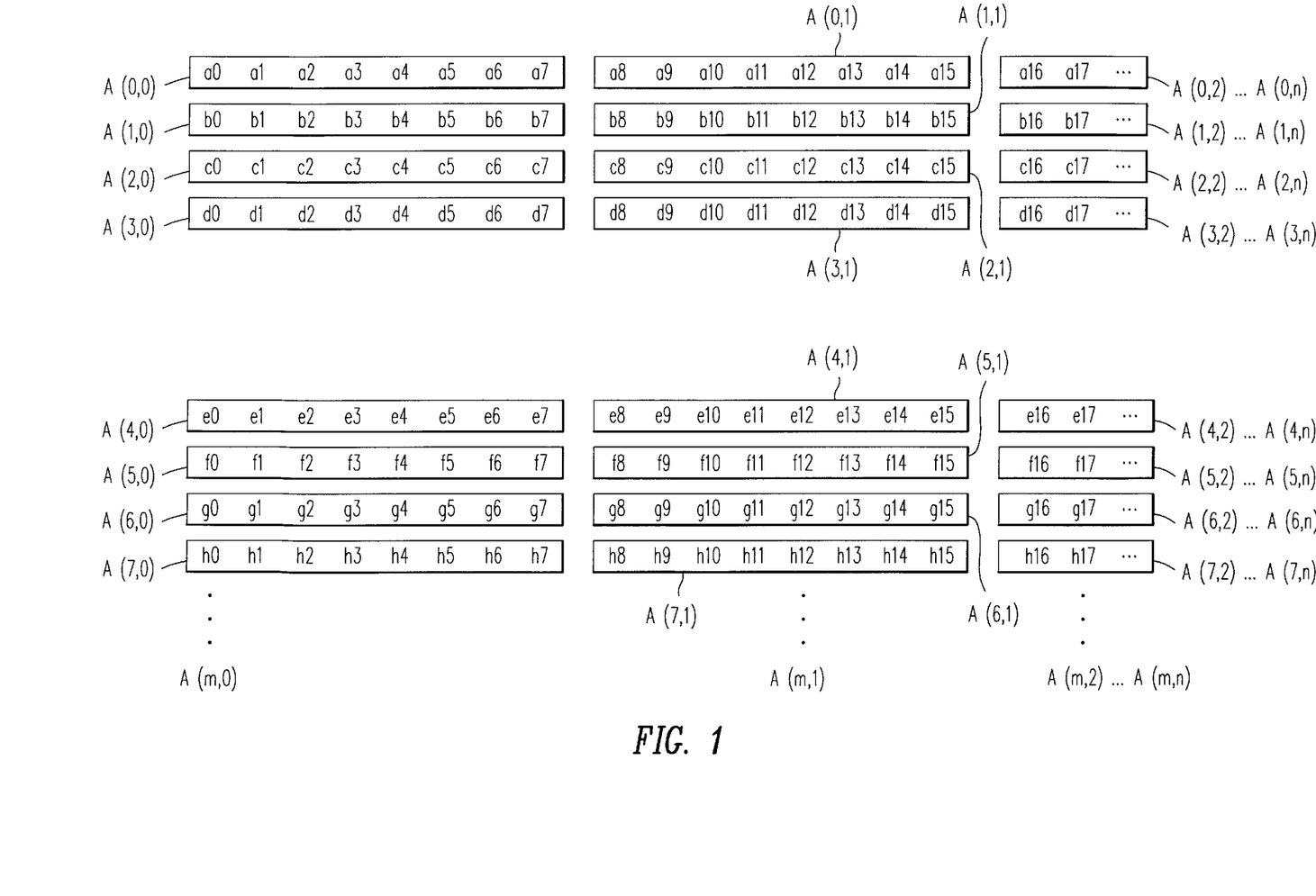
FIG. 1 shows memory image 100 of a binary image.

FIG. 1 shows memory image 100 of a binary image. As shown in FIG. 1, memory image 100 is a sequence of consecutively addressed bytes labelled A(0,0), A(0,1), A(0,2) . . . , A(0,n), A(1,0), A(1,1), A(1,2), . . . , A(1,n), A(2,0), A(2,1), . . . , A(m,n), where A(i,j) represents the (8*j)th pixel through (8*j+7)th pixel of the ith line. For example, as shown in FIG. 1, byte A(0,0) consists of pixels a0, a1, a2, . . . , a7 and byte A(2,1) consists of pixels c8, c9, c10, . . . , c15. Thus, if binary image 100 is read in sequential address order, binary image 100's pixels are read line by line and from left to right. If, as according to the teaching of the prior art, a dictionary-based compression is performed on the bit stream read in sequential address order, higher compression level resulting from redundancy in the vertical direction will not be achieved.

Figure 5A:
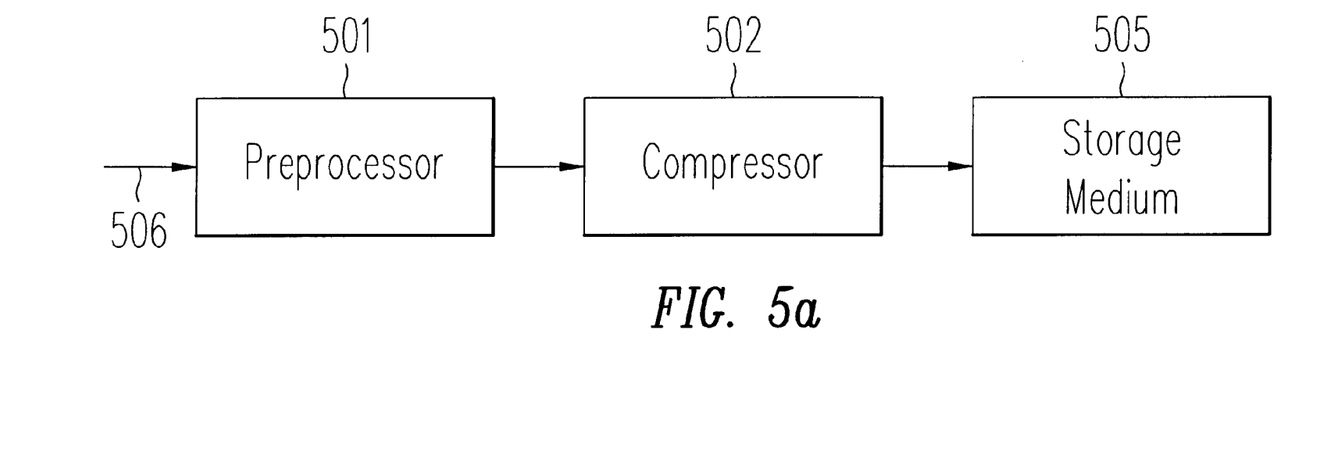
FIG. 5a shows an embodiment of the present invention including preprocessor 501 for rearranging memory image 100 of FIG. 1 to take advantage of vertical redundancy.
Figure 5B:
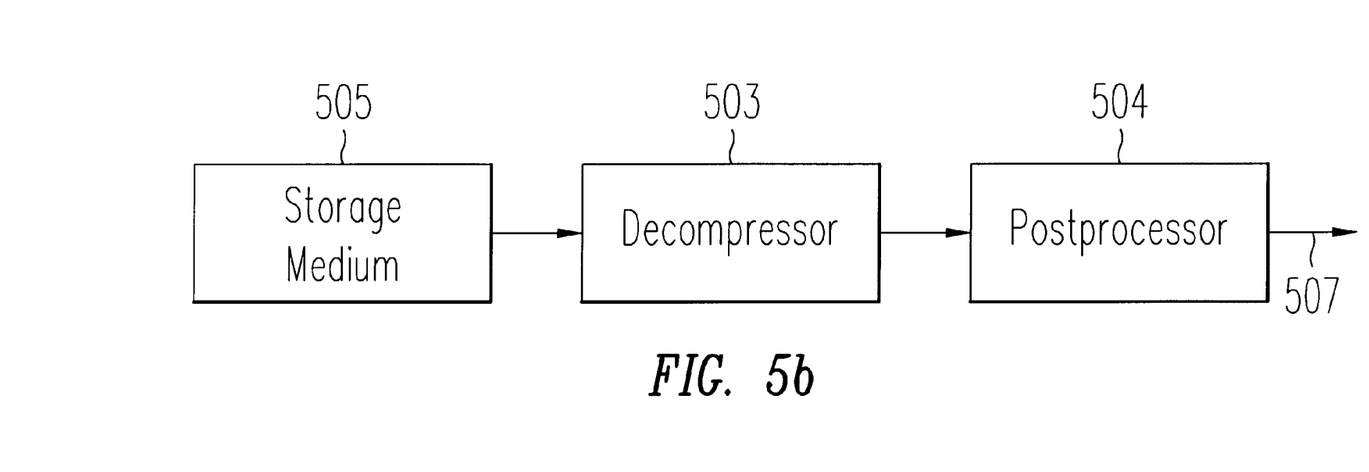
FIG. 5b shows an embodiment of the present invention including post-processor 504 to reconstitute memory image 100 upon decompression.

To include in the data compression redundancy in the vertical direction, the present invention provides, as shown in FIG. 5a, preprocessor 501 for rearranging memory image 100 into data compression units each including pixels from adjacent scan lines. Memory image 100 is received into preprocessor 501 via the path indicated by arrow 506 in FIG. 5a. The rearranged memory image is then compressed in accordance with a dictionary compression algorithm in compressor 502 to be stored in storage medium 505. To reconstitute the memory image 100 during decompression, the compressed compression data units of the rearranged memory image are retrieved from storage medium 505, decompressed in decompressor 503 and restored to memory image 100 in postprocessor 504. Memory image 100 is provided on path 507, as indicated in FIG. 5b. Preprocessor 501, compressor 502, decompressor 503 and postprocessor 504 can be each provided either as a program for a digital computer, or as a hardware module.

Figure 2:
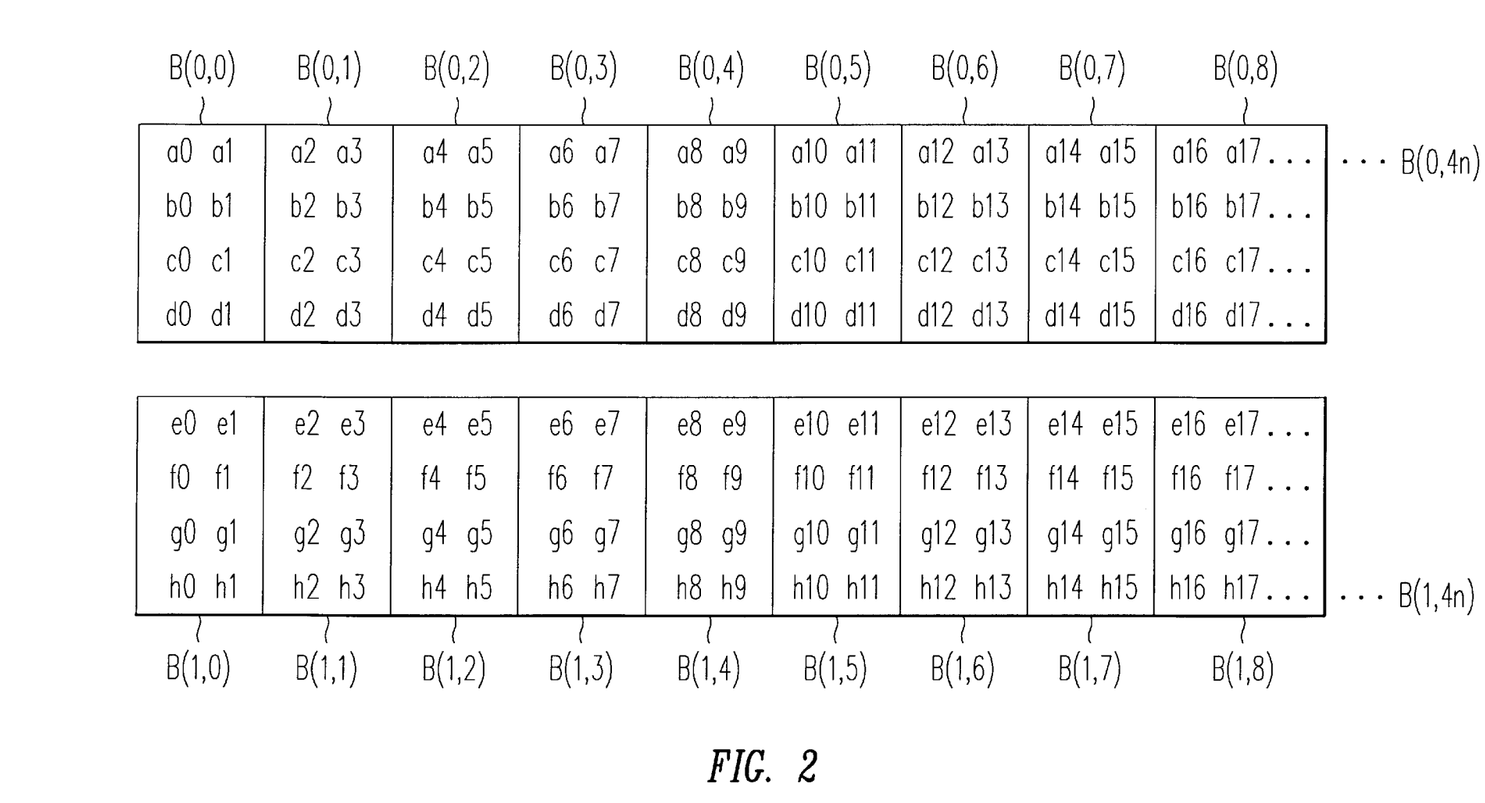
FIG. 2 shows memory image 200 of the binary image of FIG. 1.

In accordance to the present invention, binary image 100 is rearranged in memory, such that pixels in two-dimensional adjoining picture areas, rather than consecutive pixels on an image line, are sequentially read. In one embodiment, each of these adjoining picture areas is formed by a 2×4 pixel area. FIG. 2 shows memory image 200 of the binary image of FIG. 1. In FIG. 2, the consecutively addressed bytes are labelled B(0,0), B(0,1), B(0,2) . . . , B(0,4n), B(1,0), B(1,1), B(1,2), . . . , B(1,4n), B(2,0), B(2,1), . . . , B(m/4,4n), where B(i,j) represents 8 pixels in a 2×4 configuration in the binary image. For example, pixels a8, a9, b8, b9, c8, c9, d8 and d9, which are stored before the rearrangement in bytes A(0,1), A(1,1), A(2,1) and A(3,1) in FIG. 1, are stored in byte B(0,4). The bit stream obtained by reading the contents of consecutively addressed bytes of memory image 200 can then be compressed using a conventional dictionary-based compression program to take advantage of the redundancy of the binary image in the vertical direction. Of course, adjoining picture areas of other configurations are also possible, although a picture area having, as the number of pixels, a multiple of eight is preferred in an implementation where 8-bit bytes are addressed. By design choice, the unit of data in FIGS. 1 and 2 is bytes. The present invention is equally applicable where the unit of data is chosen to be memory words.

Figure 3:
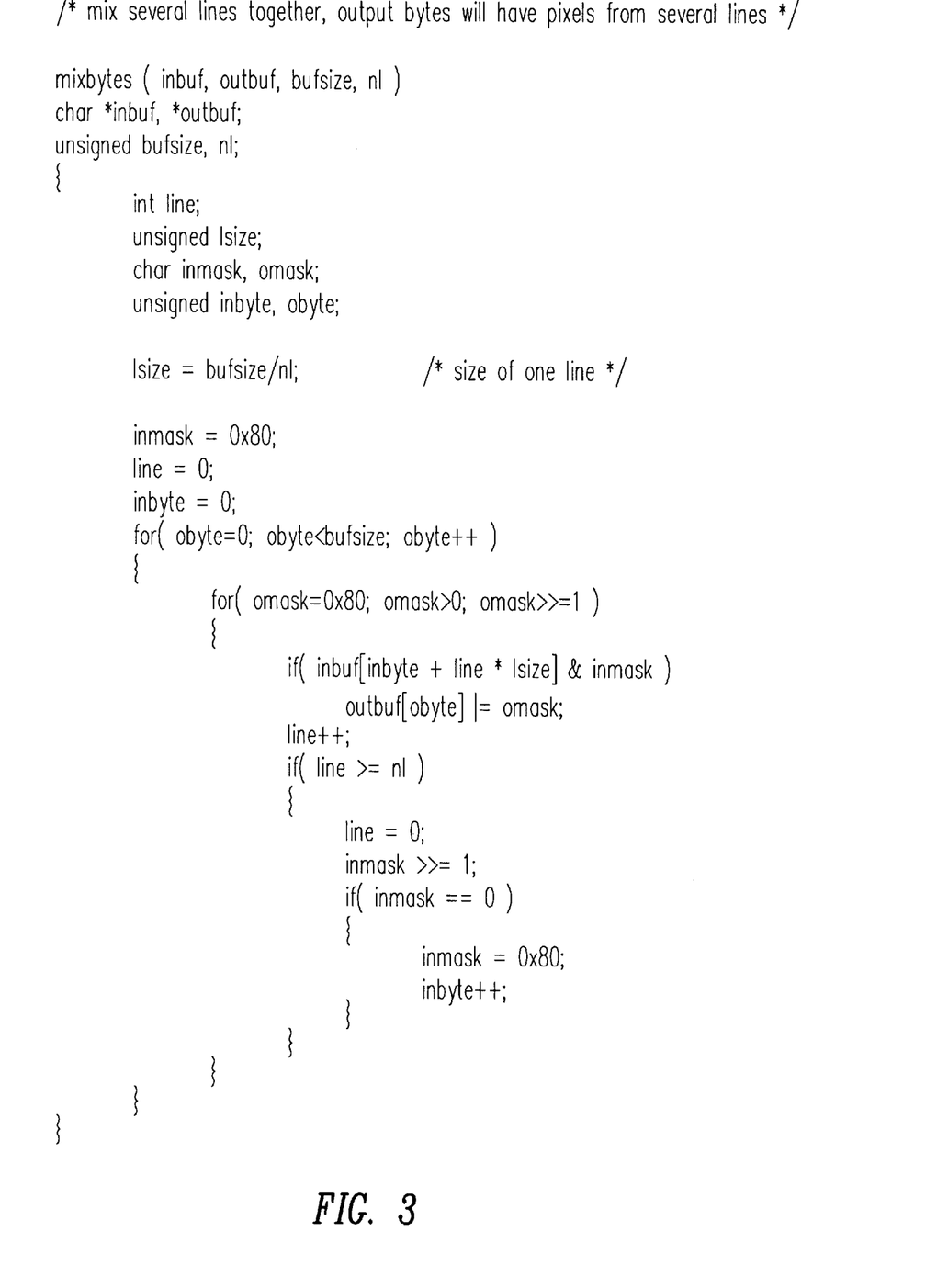
FIG. 3 shows, using the familiar "C" programming language, a routine "mixbytes" for rearranging the memory image of a binary image such that pixels in two-dimensional adjoining picture areas, rather than consecutive pixels on an image line, are sequentially read.

FIG. 3 shows, using the familiar "C" programming language, an embodiment of the present invention in a software routine "mixbytes" for rearranging the memory image of a binary image such that pixels in two-dimensional adjoining picture areas, rather than consecutive pixels on an image line, are sequentially read. In routine "mixbytes" of FIG. 3, input pixels of "nl" lines of the binary image are stored in a contiguous memory area "inbuf" of size "bufsize". (A contiguous memory area consists of consecutively addressed locations). These pixels are extracted and masked into the contiguous memory area "outbuf", such that sequential access to "outbuf" yields pixels in adjoining areas having nl pixels in the vertical dimension. Routine "Mixbytes" masks, for each column in the binary image contained in "inbuf", the nl bits in the column of pixels into consecutive bit locations in the rearranged memory image. Appendix A includes, as an example of one implementation of preprocessor 601, a utility program for providing in an output file a rearranged input binary image. The program in Appendix A, which includes the routine "mixbytes" described above, can be compiled by an ANSI standard "C" compiler and executed under an UNIX operating system environment.

Figure 6:
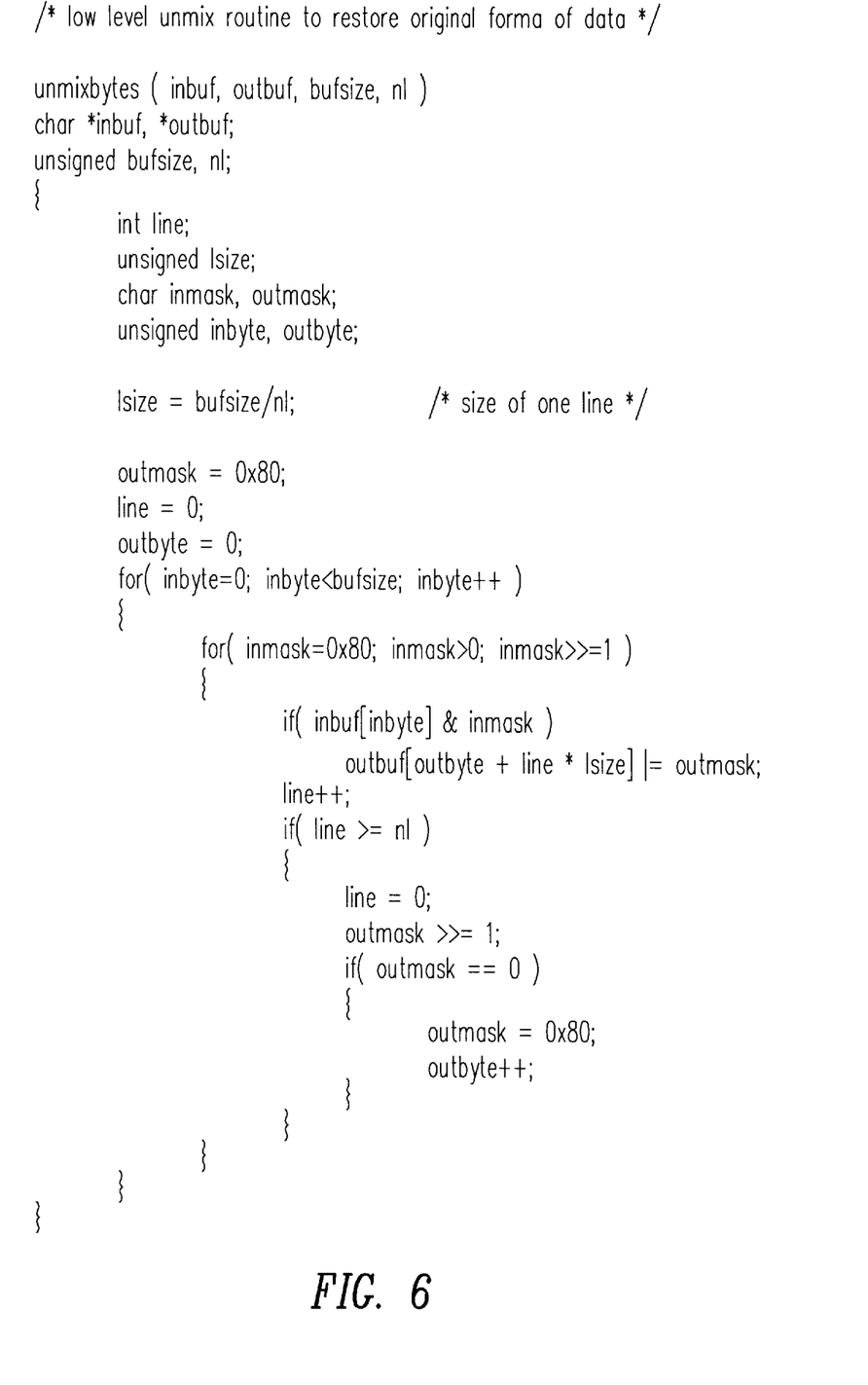
FIG. 6 shows a routine "unmixed bytes" provided to reverse the rearrangement achieved by routine "mixed byte".

To recover the original binary image, a routine "unmixbytes", which is shown in FIG. 6, is provided to reverse the rearrangement achieved by routine "mixbyte" above. Appendix B is an implementation of postprocessor 604 in a utility program, which uses the routine "unmixbytes" of FIG. 6, for restoring a binary image from a rearranged decompressed binary image. The utility program of Appendix B receives the rearranged binary image from an input file and places the recovered binary image in an output file.

Figure 7A:
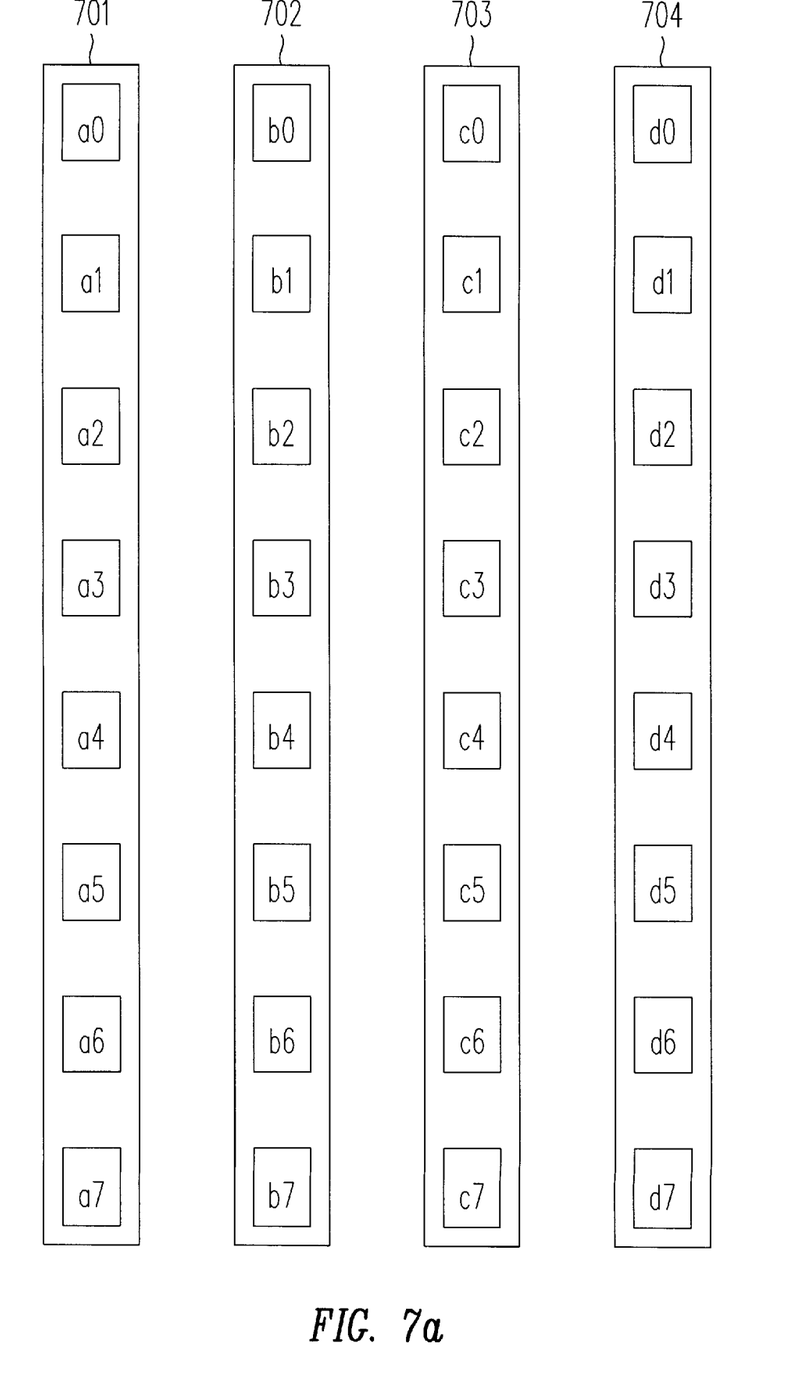
FIG. 7a shows schematically four registers 701–704 holding eight-pixel segments from four scan lines of an image.
Figure 7B:
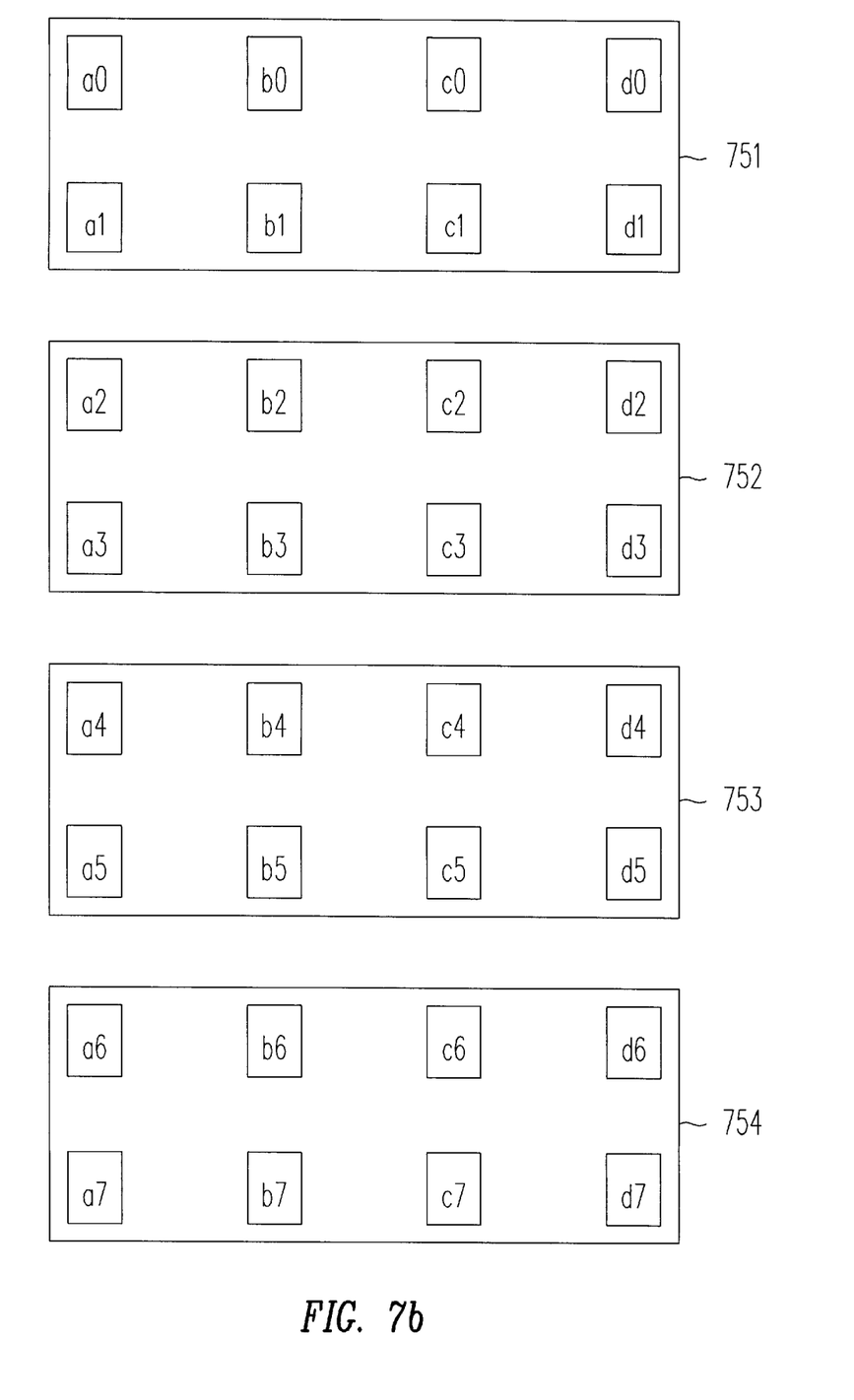
FIG. 7b shows four units of data compression (751–754) achieved by preprocessing the pixels in registers 701 to 704 prior to data compression, in accordance with the present invention.

Preprocessor 501 and postprocessor 504 can be implemented each as a hardware module as well. FIG. 7a showing schematically four registers 701–704 holding eight-pixel segments of an image. These eight-pixel segments (a0–a7, b0–b7, c0–c7 and d0–d7) are located at identical positions on four adjacent scan lines. Thus, one method to provide preprocessor 501 is to include in each 8-bit unit of data compression two pixels from each scan line. FIG. 7b shows four units of data compression (751–754) achieved by extracting selected pixels in registers 701 to 704 prior to data compression.

Figure 7C:
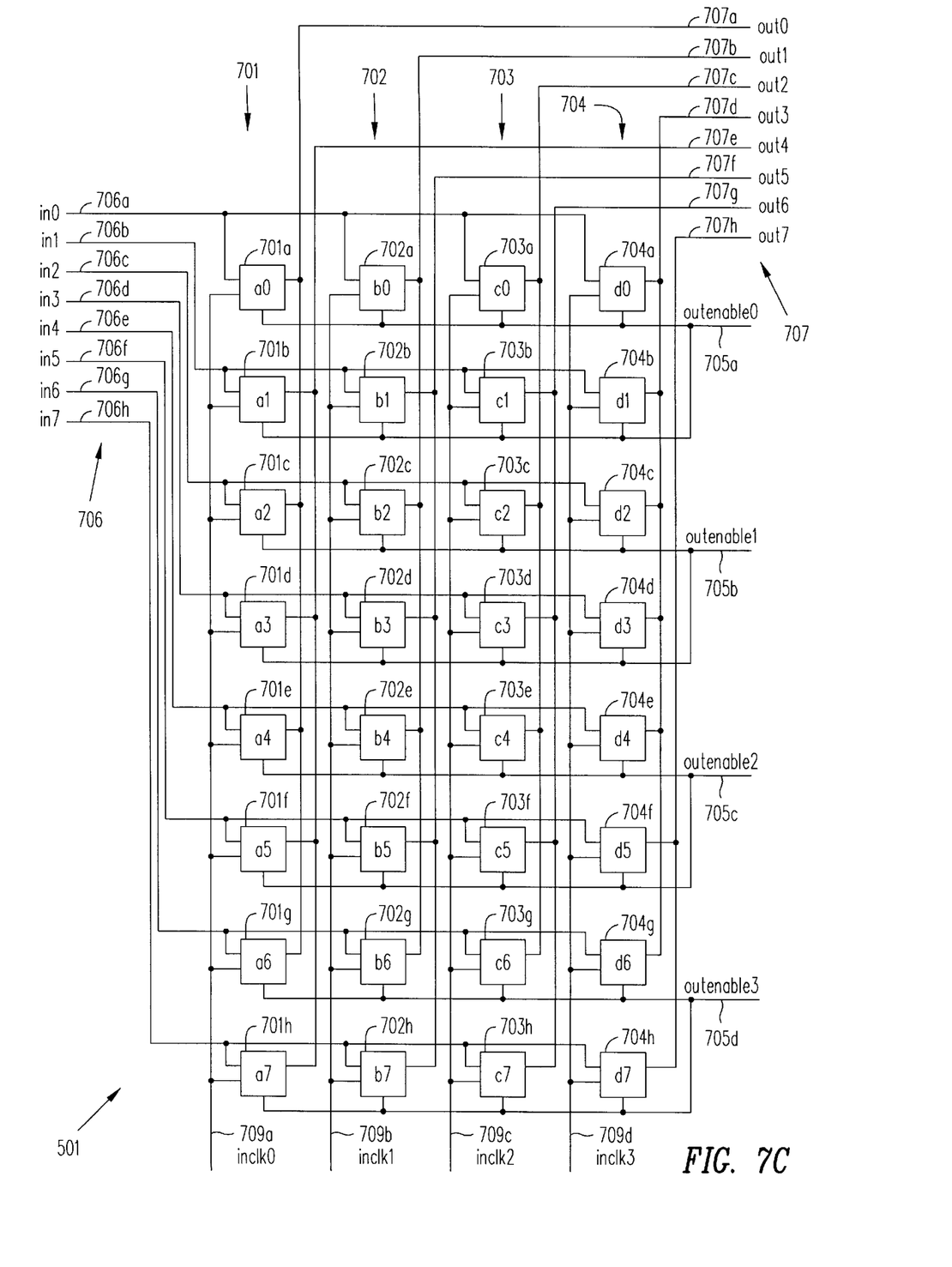
FIG. 7c shows one hardware implementation for the preprocessing scheme of FIGS. 7a and 7b.

One hardware implementation of the scheme shown in FIGS. 7a and 7b is shown in FIG. 7c. As shown in FIG. 7c, registers 701–704 are each formed by eight flip-flops coupled to 8-bit bus 706. The four eight-pixel segments of corresponding positions in four scan lines are individually loaded into registers 701–704 at different times by clock input signals 709a, 709b, 709c and 709d respectively. Rearranged eight-pixel data compression units 751–754 are then output onto 8-bit bus 707 individually by output control signals 705a–705d, respectively.

Figure 8:
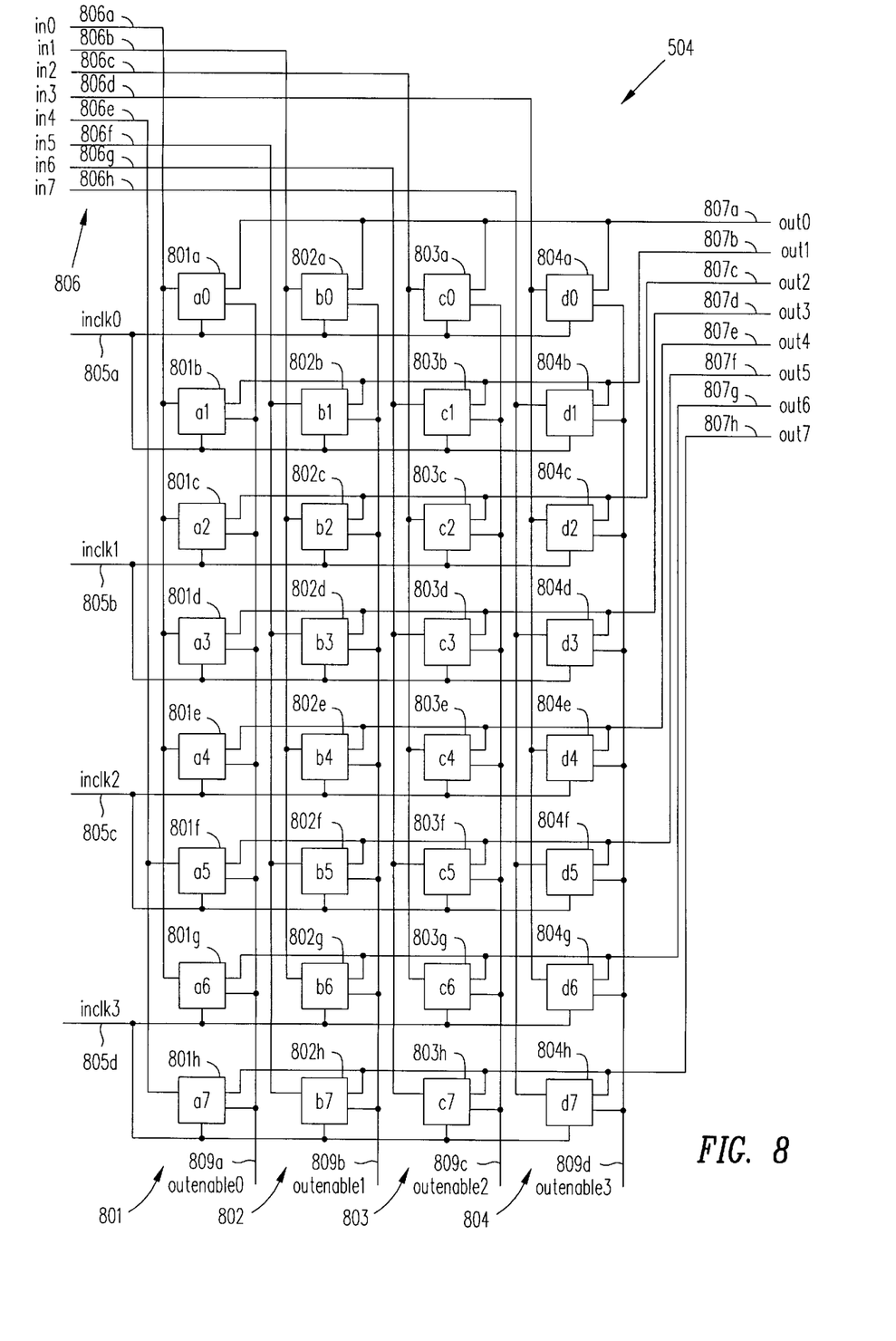
FIG. 8 shows a hardware implementation of postprocessor 504, which corresponds to the hardware implementation of preprocessor 501 of FIG. 7c.

A hardware implementation of postprocessor 504, corresponding to the hardware implementation of preprocessor 501 described above, can be implemented using the circuit shown in FIG. 8. As shown in FIG. 8, the four rearranged decompressed eight-pixel data compression units are provided individually on 8-bit bus 806 and are loaded into 8-bit registers 801 (a0–a7), 802 (b0–b7), 803 (c0–c7) and 804 (d0–d7), two bits per register at a time, by clock signals 805a, 805b, 805c and 805d. For example, the first eight-pixel data compression unit is loaded into the first two bits of each of registers 801–804 (i.e. a0, a1, b0, b2, c0, c1, d0 and d1) by clock signal 805a. After all four eight-pixel data compression units are loaded, output control signals 801–804 are activated at different times to output the restored eight-pixels segments of the four scan lines on to 8-bit bus 809.

Figure 4:
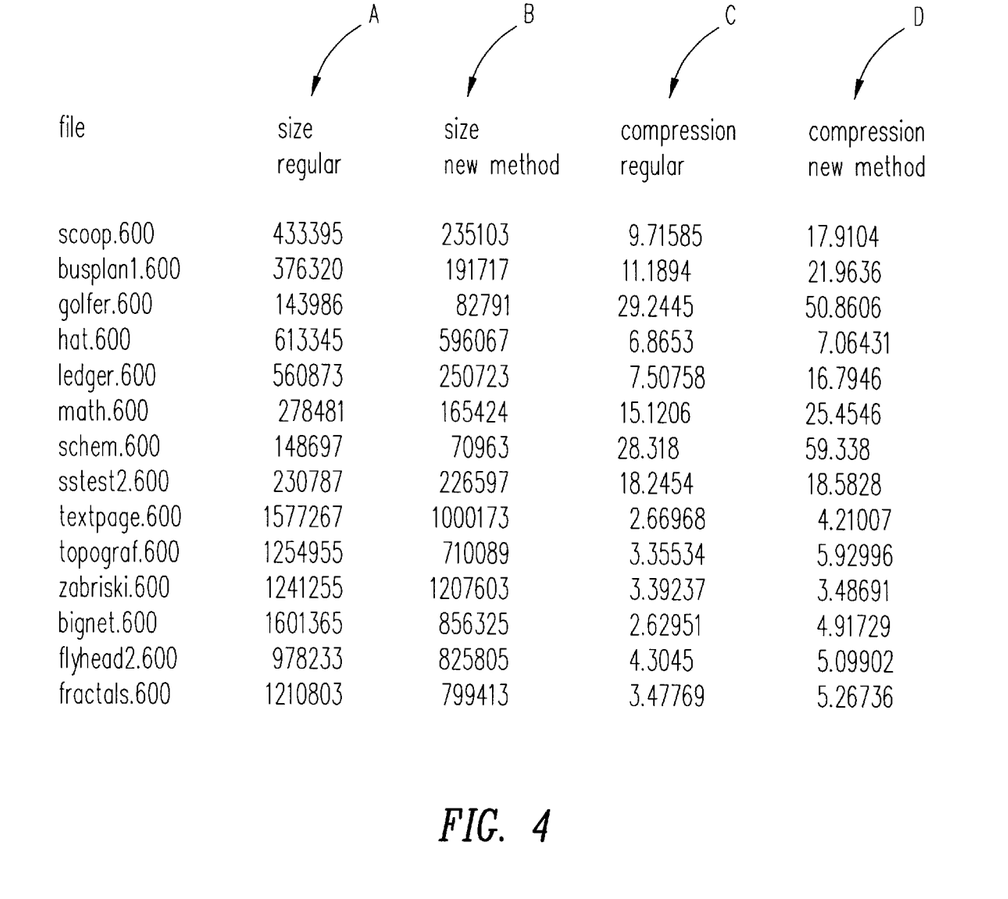
FIG. 4 summarizes the results of an experiment on the effectiveness of the present invention.

FIG. 4 summarizes the results of an experiment on the effectiveness of the present invention. FIG. 4 lists fourteen files each containing an image digitized at the resolution of 600 dots per inch (dpi). In FIG. 4, columns "A" and "C" show, respectively, the sizes of the compressed files without rearrangement under the present invention and the compression ratios thus achieved. Columns "B" and "D" show, respectively, the sizes of the compressed files with rearrangement under the present invention and the compression ratios thus achieved. Upon comparison of the compression ratios and the file sizes for each file listed, it is seen that substantial improvement in compression is achieved in almost every instance. Also, little improvement is achieved when the binary image is a random bit pattern.

The technique of the present invention is believed to be applicable also to a 3-dimensional image. Further, because, prior to compression, the rearranged binary image of the present invention has the same size as the original line-by-line binary image, the times required for compressing the rearranged binary image and the original image are substantially the same.

The above detailed description is provided to illustrate the specific embodiments of the present invention and is not intended to be limiting. Variations and modifications within the scope of the present invention are possible. The present invention is defined by the following claims.

APPENDIX A

```
/*
 *  mixx - read the file containing 300dpi or 600dp binary image,
 *  reorganize the bytes to contain bits from several (2, 4, 8)
 *  lines and write data to output file
 */
#include <stdio.h>
```

-continued

```
#include <sys/types.h>
#include <sys/stat.h>
#include <fcntl.h>
main( argc, argv )
int argc;
char **argv;
{
    int fd1, fd2;
    int jj;
    int kk;
    int ll;
    char *inbuf;
    char *mixbuf;
    unsigned dpi;
    unsigned intlv;
    unsigned linesize;
    unsigned nolines;
    unsigned bufsize;
    unsigned nomixlines;
    if( argc != 3 )
    {
        printf("wrong number of arguments\n");
        usage( );
        return;
    }
    /* get the resolution */
    dpi = atoi( argv[1] );
    switch( dpi )
    {
        case 300:
            linesize = 319;
            nolines = 3300;
            break;
        case 600:
            linesize = 638;
            nolines = 6600;
            break;
        default:
            printf("wrong dpi argument\n");
            usage( );
            return;
    }
    /* how many lines are we going to mix */
    intlv = atoi( argv[2] );
    if( (intlv != 2) && (intlv != 4) && (intlv != 8) )
    {
        printf ("wrong interleave argument\n");
        usage( );
        return;
    }
    /* buffer should contain all the lines that are going
        to be mixed toghether */
    bufsize = linesize * intlv;
    inbuf = (char *)malloc( bufsize );
    if( inbuf == NULL )
    {
        printf("could not allocate input buffer\n");
        return;
    }
    mixbuf = (char *)malloc( bufsize );
    *if( mixbuf == NULL )
    {
        printf("could not allocate output buffer\n");
        free( inbuf );
        return;
    }
    /* open input and output files */
    fd1 = open( "test.in", O_RDONLY );
    if( fd1 < 0 )
    {
        printf("could not open test.in\n");
        free( inbuf );
        free( mixbuf );
        return;
    }
    fd2 = creat( "test.out", 0644 );
    if( fd2 < 0 )
    {
        close( fd1 );
        free( inbuf );
```

```
                free( mixbuf );
                printf("could not open test.out\n");
                return;
            }
            /* main loop, read the lines, mix them and output them */
            nomixlines = nolines / intlv;
            for( jj=0; jj<nomixlines; jj++ )
            {
                if( read( fd1, inbuf, bufsize ) <= 0 )
                {
                    close( fd1 );
                    close( fd2 );
                    free( inbuf );
                    free( mixbuf );
                    printf("error reading test in\n");
                    return;
                }
                for( ll=0; ll<bufsize; ll++ )
                    mixbuf[ll] = 0;
                mixbytes( inbuf, mixbuf, bufsize, intlv );
                if( write( fd2, mixbuf, bufsize ) <= 0 )
                {
                    close( fd1 );
                    close( fd2 );
                    free( inbuf );
                    free( mixbuf );
                    printf ("error writing test out\n");
                    return;
                }
            }
            free( inbuf );
            free( mixbuf );
            close( fd1 );
            close( fd2 );
        }
        /* mix several lines together, output bytes will have pixels
            from several lines */
        mixbytes( inbuf, outbuf, bufsize, n1 )
        char *inbuf, *outbuf;
        unsigned bufsize, n1;
        {
            int line;
            unsigned 1size;
            char inmask, omask;
            unsigned inbyte, obyte;
            1size = bufsize/n1;    /* size of one line */
            inmask = 0x80;
            line = 0;
            inbyte = 0;
            for( obyte=0; obyte<bufsize; obyte++ )
            {
                for( omask=0x80; omask>0; omask>>=1 )
                {
                    if( inbuf[inbyte + line * 1size] & inmask )
                        outbuf[obyte] |= omask;
                    line++;
                    if( line >= n1 )
                    {
                        line = 0;
                        inmask >>= 1;
                        if( inmask == 0 )
                        {
                            inmask = 0x80;
                            inbyte++;
                        }
                    }
                }
            }
        }
        usage( )
        {
            printf("usage: mixx dpi interleave \n");
            printf("example: mixx 300 4 \n");
        }
```

APPENDIX B

```
/* reconstruct original data after decompresson */
main( argc, argv )
int argc;
char **argv;
{
    int fd1; fd2;
    int jj;
    int kk;
    int ll;
    char *inbuf;
    char *unmixbuf;
    unsigned dpi;
    unsigned intlv;
    unsigned linesize;
    unsigned nolines;
    unsigned bufsize;
    unsigned nomixlines;
    if( argc != 3 )
    {
        printf("wrong number of arguments\n");
        usage( );
        return;
    }
    dpi = atoi( argv[1] );
    switch ( dpi )
    {
        case 300:
            linesize = 319;
            nolines = 3300;
            break;
        case 600:
            linesize = 638;
            nolines = 6600;
            break;.
        default:
            printf("wrong dpi argument\n");
            usage( );
            return;
    }
    intlv = atoi( argv[2] );
    if( (intlv != 2) && (intlv != 4) && (intlv != 8) )
    {
        printf("wrong interleave argument\n");
        usage ( );
        return;
    }
    bufsize = linesize * intlv;
    inbuf = (char *)malloc( bufsize );
    if( inbuf == NULL )
    {
        printf("could not allocate input buffer\n");
        return;
    }
    unmixbuf = (char *)malloc( bufsize );
    if( unmixbuf == NULL )
    {
        printf("could not allocate output buffer\n");
        free( inbuf );
        return;
    }
    fd1 = open( "test.out", O_RDONLY );
    if( fd1 < 0 )
    {
        printf("could not open test.out\n");
        free( inbuf );
        free( unmixbuf );
        return;
    }
    fd2 = creat( "test.umx", 0644 );
    if( fd2 < 0 )
    {
        close( fd1 );
        free( inbuf );
        free( unmixbuf );
        printf("could not open test.umx\n");
        return;
    }
    nomixlines = nolines / intlv;
    for( jj=0; jj<nomixlines; jj++ )
    {
        if( read( fd1, inbuf, bufsize ) <= 0 )
        {
            close( fd1 );
```

-continued

```
        close( fd2 );
        free( inbuf );;
        free( unmixbuf );
        printf ("error reading test.in\n");
        return;
    }
    for( 11=0; 11<bufsize; 11++ )
        unmixbuf[11] = 0;
    unmixbytes( inbuf, unmixbuf, bufsize, intlv );
    if( write( fd2, unmixbuf, bufsize ) <= 0
        close( fd1 );
        close( fd2 );
        free( inbuf );
        free( unmixbuf );
        printf("error writing.test.out\n");
        return;
    }
    }
    free( inbuf );
    free ( unmixbuf );
    close( fd1 );
    close( fd2 );
}
/* low level unmix route to restore original format data */
unmixbytes( inbuf, outbuf bufsize, n1 )
char *inbuf, *outbuf;
unsigned bufsize, n1;
{
    int line;
    unsigned 1size;
    char inmask, outmask;
    unsigned & inbyte, outbyte;
    1size = bufsize/n1;   /* size of one line */
    outmask = 0x80;
    line = 0;
    outbyte = 0;
    for( inbyte=0; inbyte<bufsize; inbyte++ )
    {
        for( inmask=0x80; inmask>0; inmask>>=1 )
        {
            if( inbuf[inbyte] & inmask )
                outbuf[outbyte + line * 1size] |= outmask;
            line++;
            if( line >= n1 )
            {
                line = 0;
                outmask >>= 1;
                if( outmask == 0 )
                {
                    outmask = 0x80;
                    outbyte++;
                }
            }
        }
    }
}
```

I claim:

1. An apparatus for compressing a binary image, said binary image including a plurality of scan lines, each scan line having a plurality of pixels, said apparatus comprising:

a preprocessor for (i) segmenting each scan line of said binary image into segments of equal number of pixels, (ii) grouping said binary image into data groups, each data group including a segment of pixels from each of a predetermined number of adjacent scan lines, wherein said segments of pixels in each data group represents pixels at corresponding locations in said predetermined number of adjacent scan lines, and (iii) dividing each data group into a predetermined number of data units, each data unit including pixels selected from each of said predetermined number of adjacent scan lines within said data group said preprocessor comprising a plurality of registers, equalling in number to said predetermined number of adjacent scan lines, for receiving a data group, wherein each register receives one of said segments of pixels in said data group received;

said preprocessor further comprising a first control circuit, receiving a data group of said binary image at a time, said first control circuit loading said segments of pixels of said data group into said plurality of registers; and said preprocessor further comprising a second control circuit, said second control circuit extracting from said plurality of registers said data units; and a compressor, receiving said data units sequentially, for applying a dictionary data compression algorithm on said data units received.

2. An apparatus as in claim 1, wherein said segments of pixels in said data group received in said first control circuit are provided to said registers sequentially, and wherein each register includes a plurality of individually enabled output signals, said second control circuit extracting said data units by activating sequentially selected sets of said individually enabled output signals, each of said selected set includes an output signal from each of said plurality of registers.

3. A system including said apparatus of claim 1, further comprising:

a decompressor, said decompressor undoing data compression performed in accordance with said compression algorithm; and a postprocessor, said postprocessor restoring said binary image from said data units.

4. A system as in claim 3, wherein said postprocessor comprises:

a plurality of registers, equalling in number to said predetermined number of adjacent scan lines, for receiving data units of a data group, wherein each register capable of holding a segment of pixels in said data group;

a first control circuit, receiving data units of a data group of said binary image at a time, said first control circuit loading said data units into said plurality of registers, such that each register contains a segment of pixels of said data group; and a second control circuit, said second control circuit outputting from said plurality of registers each a segment of said data group.

* * * * *